United States Patent
Okamoto et al.

(10) Patent No.: US 8,363,989 B2
(45) Date of Patent: Jan. 29, 2013

(54) SEMICONDUCTOR OPTICAL INTERCONNECTION DEVICE AND SEMICONDUCTOR OPTICAL INTERCONNECTION METHOD

(75) Inventors: Daisuke Okamoto, Tokyo (JP); Kenichi Nishi, Tokyo (JP); Junichi Fujikata, Tokyo (JP); Jun Ushida, Tokyo (JP)

(73) Assignee: NEC Corporation, Tokyo (JP)

( * ) Notice: Subject to any disclaimer, the term of this patent is extended or adjusted under 35 U.S.C. 154(b) by 307 days.

(21) Appl. No.: 12/919,461

(22) PCT Filed: Feb. 10, 2009

(86) PCT No.: PCT/JP2009/052194
§ 371 (c)(1),
(2), (4) Date: Aug. 25, 2010

(87) PCT Pub. No.: WO2009/119166
PCT Pub. Date: Oct. 1, 2009

(65) Prior Publication Data
US 2011/0002582 A1 Jan. 6, 2011

(30) Foreign Application Priority Data
Mar. 24, 2008 (JP) .................................. 2008-075014

(51) Int. Cl.
*G02B 6/12* (2006.01)
*H01L 21/02* (2006.01)
(52) U.S. Cl. .......... 385/14; 257/778; 348/308; 29/25.01
(58) Field of Classification Search .................... 385/12, 385/14–16; 257/737, 738, 773, 778, 782, 257/E23.116, E23.068, E21.502; 29/25.01; 348/308
See application file for complete search history.

(56) References Cited

U.S. PATENT DOCUMENTS

| | | | | |
|---|---|---|---|---|
| 6,798,072 B2 * | 9/2004 | Kajiwara et al. | .............. | 257/778 |
| 7,651,279 B2 * | 1/2010 | Ohtorii | ............................ | 385/89 |
| 8,144,277 B2 * | 3/2012 | Kawahara et al. | .............. | 349/33 |
| 8,258,633 B2 * | 9/2012 | Sezi et al. | ....................... | 257/782 |
| 2005/0220404 A1 * | 10/2005 | Flers et al. | ....................... | 385/33 |

FOREIGN PATENT DOCUMENTS

| | | |
|---|---|---|
| JP | 64-53440 A | 3/1989 |
| JP | 8-274296 A | 10/1996 |
| JP | 2001237411 A | 8/2001 |

(Continued)

OTHER PUBLICATIONS

International Search Report for PCT/JP2009/052194 mailed May 19, 2009.

(Continued)

*Primary Examiner* — Akm Enayet Ullah

(57) ABSTRACT

Provided is a semiconductor optical interconnection device capable of transmitting signals between laminated semiconductor chips in a structure where semiconductor chips highly functionalized by being bonded to an optical interconnection chip are laminated. The semiconductor optical interconnection device includes a semiconductor chip 1 and an optical interconnection chip 2. The optical interconnection chip 2 includes an optical element formed thereon (for instance, a photo-sensitive element, a luminous element, or an optical modulator) which has a function relating to signal conversion between light and electricity. The semiconductor chip 1 includes a transmission section 3 (for instance, a coil or an inductor) to transmit signals in a non-contact manner, and a connection section 4 (for instance, a bump) to electrically connect with the optical element.

18 Claims, 6 Drawing Sheets

FOREIGN PATENT DOCUMENTS

| | | |
|---|---|---|
| JP | 3413839 B | 6/2003 |
| JP | 2004349558 A | 12/2004 |
| JP | 2005522861 A | 7/2005 |
| JP | 2005228981 A | 8/2005 |
| JP | 2005535116 A | 11/2005 |
| JP | 2008048313 A | 2/2008 |

OTHER PUBLICATIONS

K. Ohashi, "On-chip Optical Interconnect Technology", 2007 Semiconductor MIRAI project results debriefing session, Semiconductor MIRAI project publication, Dec. 18, 2007, pp. 78-92.

* cited by examiner

SEMICONDUCTOR OPTICAL INTERCONNECTION DEVICE AND SEMICONDUCTOR OPTICAL INTERCONNECTION METHOD

This application is the National Phase of PCT/JP2009/052194, filed Feb. 10, 2009, which is based upon and claims the benefit of priority from Japanese patent application No. 2008-075014, filed on Mar. 24, 2008, the disclosure of which is incorporated herein in its entirety by reference.

TECHNICAL FIELD

The present invention relates to a semiconductor optical interconnection device and method for achieving high functionality and high reliability by laminating a semiconductor chip and an optical interconnection chip.

BACKGROUND ART

Along with the progress of miniaturization of LSIs, problems such as signal transmission delay, reliability of signal lines, signal interference, increase in power consumption have become evident in the electric wiring technique. Application of optical wiring to signal transmission in an LSI chip has been studied to solve these problems. For example, Non-Patent Document 1 discloses an example using the optical wiring for the signal transmission within an LSI chip. In an LSI optical interconnection structure in this document, surfaces of an LSI chip and an optical interconnection chip are bonded together. This bonded structure is able to achieve a high-performance chip with almost no change of a related LSI design rule and a manufacturing process, because the LSI chip and the optical interconnection chip are separately manufactured.

Patent Document 1 discloses a structure using light for the signal transmission between laminated LSI chips. The use of wavelengths at which a substrate constituting a chip becomes transparent enables data transmission between laminated LSI chips.

Patent Document 2 discloses an inductive coupling system which enables signal transmission in a non-contact manner. The use of the inductive coupling system makes it possible to perform highly efficient signal transmission between the LSI chips in a laminating direction in a non-contact manner without necessity to form a direct electric connection.

In general, there is known a method for transmitting signals between laminated LSI chips by forming a through-hole in a laminated SIP (System in Package).

[Patent Document 1] Japanese Patent No. 3413839 (page 4, FIG. 4)
[Patent Document 2] Japanese Unexamined Patent Application Publication No. 2005-228981 (page 4, FIG. 1)
[Non-Patent Document 1] Keishi Ohashi, "On-chip Optical Interconnect Technology", 2007 Semiconductor MIRAI project results debriefing session, Semiconductor MIRAI project publication, Dec. 18, 2007, page 82.

DISCLOSURE OF INVENTION

Technical Problem

In the bonded structure of Non-Patent Document 1, when an SiP is configured by laminating a plurality of LSI chips which are bonded to optical interconnection chips, the optical interconnection chip is between the LSI chips. This causes a problem that it is difficult to transmit signals between the laminated LSI chips. A bonding process itself is relatively easy, since the surfaces of the LSI chips are bonded together. However, there is another problem that it is difficult to form an electrode to input/output the signals to/from an outside.

In a laminated structure disclosed in Patent Document 1, the use of an optical signal enables high-speed signal transmission in a non-contact manner. However, there is a problem in that a highly precise alignment is required to perform an optical coupling between laminated chips with high efficiency. There is another problem in that light reflects or scatters at an interface, even if the wavelengths at which a substrate material becomes transparent are used in a system to transmit the signals in a vertical direction in such a way that light passes through the laminated chip board, which causes deterioration of the signal intensity.

An inductive coupling system disclosed in Patent Document 2 is not suitable for high-speed signal transmission in a horizontal direction within chips, and it is difficult to highly functionalize the LSI chip itself.

Furthermore, regarding a generally known with a through-hole, in a laminated structure having an optical interconnection chip, when the through-hole is formed in the optical interconnection chip, it is necessary to dispose an optical waveguide to keep away from this through-hole. This causes a problem that an optical wiring layout is greatly restricted.

An object of this invention is to provide a semiconductor optical interconnection device and method capable of performing highly-efficient signal transmission among laminated semiconductor chips by using an optical interconnection chip in a structure having semiconductor chips laminated therein.

Technical Solution

In one exemplary aspect of the present invention, a semiconductor optical interconnection device includes an optical interconnection chip having an optical element therein, the optical element having a function relating to signal conversion between light and electricity; and a semiconductor chip that includes a transmission section to transmit a signal in a non-contact manner, and a connection section to electrically connect with the optical element.

In another exemplary aspect of the present invention, a method of forming a semiconductor optical interconnection device includes producing an optical interconnection chip having an optical element formed thereon, the optical element having a function relating to signal conversion; producing a semiconductor chip that includes a transmission section to transmit a signal in a non-contact manner; forming a connection section to electrically connect with the optical element on the semiconductor chip; and laminating the optical interconnection chip and the semiconductor chip so as to electrically connect the optical interconnection chip and the semiconductor chip.

Advantageous Effects

According to the present invention, it is possible to provide a semiconductor optical interconnection device and method capable of performing highly-efficient signal transmission among laminated semiconductor chips by using an optical interconnection chip in a structure having semiconductor chips laminated therein.

EXPLANATION OF REFERENCE 1, 1a, 1b, 1-1, 1-2, 20 LSI CHIP
2, 2a, 2b, 2-1, 2-2, 21 OPTICAL INTERCONNECTION CHIP
3 TRANSMISSION SECTION
4 CONNECTION SECTION
5 MOUNTED BOARD
6 SPACER
7 CONNECTING BUMP
8 COIL
9 EXTERNALLY-CONNECTED WIRE
10 OPTICAL WAVEGUIDE
11 OPTICAL BRANCHING STRUCTURE
12 CLOCK SIGNAL LIGHT
13 PHOTO-SENSITIVE ELEMENT
14 PHOTO-SENSITIVE ELEMENT CONNECTING BUMP
15 LUMINOUS ELEMENT
16 OPTICAL MODULATOR
17-1-17-4 PROCESSOR CORE
18 LUMINOUS ELEMENT CONNECTING BUMP
19 OPTICAL MODULATOR CONNECTING BUMP
22 EXTERNAL I/O CHIP

BEST MODE FOR CARRYING OUT THE INVENTION

Hereinafter, embodiments of the present invention will be described with reference to the drawings. For clarification of explanation, the following description and drawings are appropriately omitted and simplified. In each drawing, components having the same configuration or function, and corresponding parts are denoted by the same reference symbols, and a description thereof is omitted.

Figure 2:
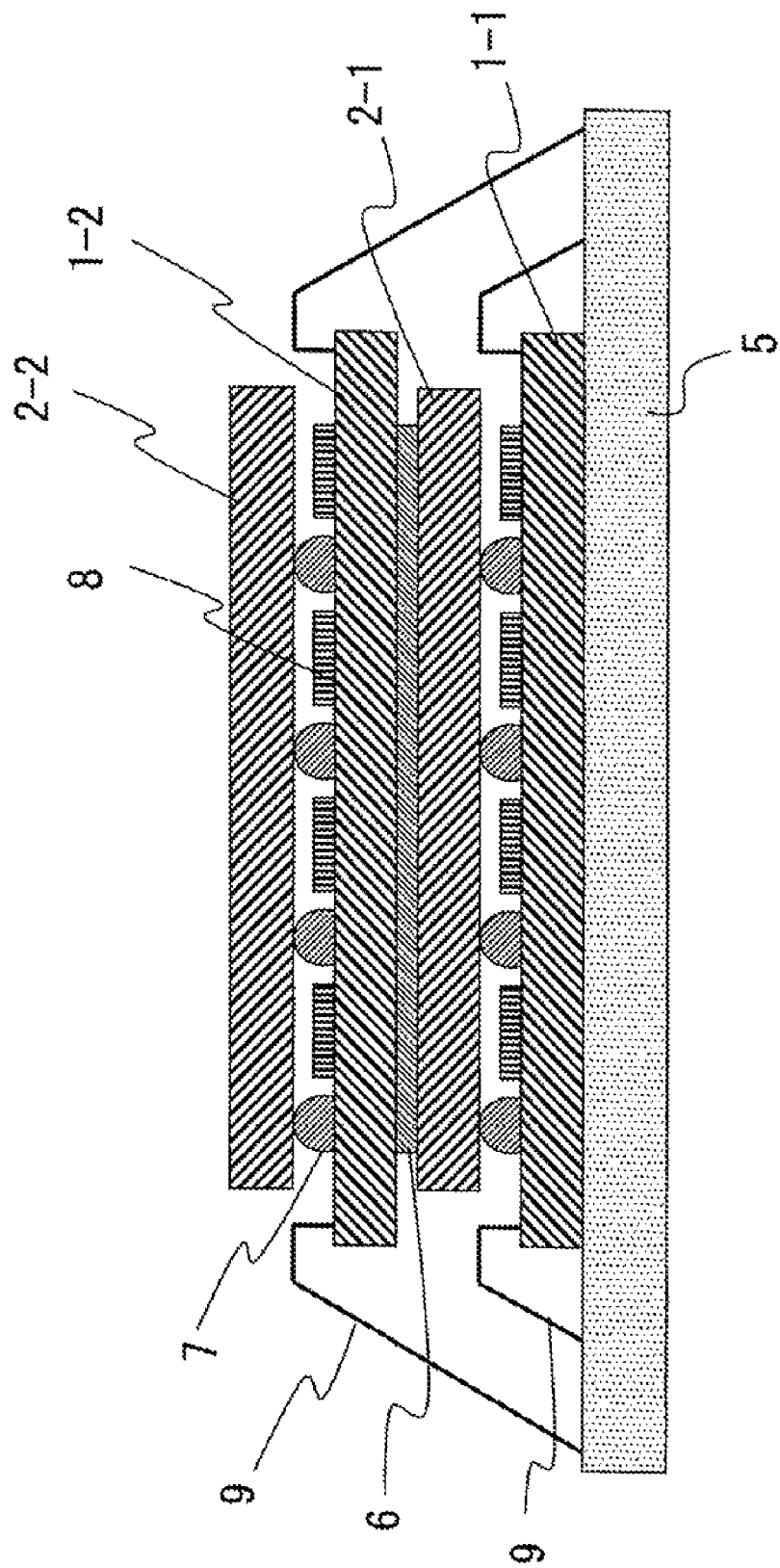
FIG. 2 is a cross-section view showing an exemplary configuration in which the semiconductor optical interconnection device shown in FIG. 1 is laminated.

Furthermore, there are several identical components in the present specification. Therefore, these components are distinguished from each other by adding "-n" (n is an integer greater than 0) to the sign of the components. For example, FIG. 2 shows a plurality of LSI chips 1-1 and 1-2. In the description of the specification, the term "LSI chip 1" refer to one or more of the plurality of LSI chips 1-1 and 1-2, and the term "LSI chip 1-1 (or LSI chip 1-2 etc.)" or the like is used to distinguish the LSI chips from each other. The sign added a suffix (for example, "a" or "b") is used to represent a different aspect of examples.

Figure 1:
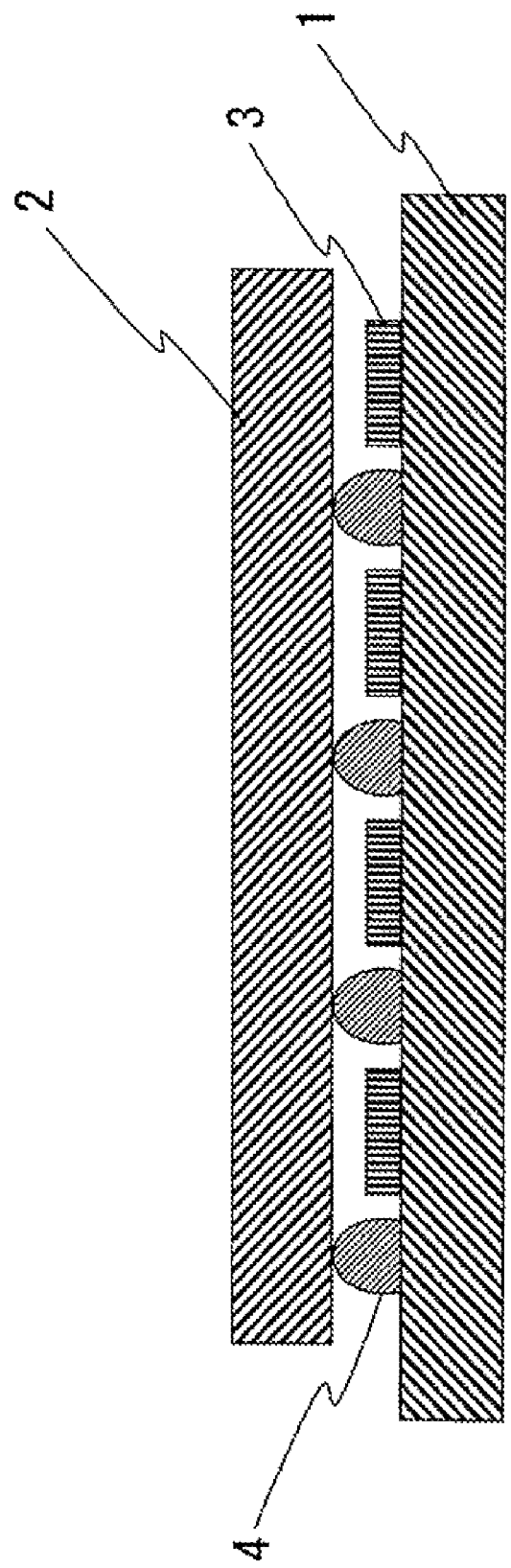
FIG. 1 is a cross-section view showing a configuration example of a semiconductor optical interconnection device of an exemplary embodiment of this invention.

FIG. 1 is a cross-section view showing a configuration example of a semiconductor optical interconnection device of an exemplary embodiment of this invention. The semiconductor optical interconnection device shown in FIG. 1 includes a semiconductor chip 1 and an optical interconnection chip 2. In the following explanation, the term "semiconductor chip" is referred to as "LSI chip"

The LSI chip 1 includes a transmission section 3 to transmit a signal in a non-contact manner, and a connection section 4 to electrically connect with an optical element. The transmission section 3 and the connection section 4 are disposed in an area without electric interference.

The transmission section 3 may be formed using a coil or an inductor, for example. The transmission section 3 may also be formed using means such as a capacity coupling (C coupling) that transmits signals through a capacitor. However, the transmission distance in this capacity coupling is generally shorter than that in the case of using the coil.

The connection section 4 may be formed using a bump. Due to electric connection using the bump, the semiconductor chip 1 and the optical interconnection chip 2 are bonded together. For instance, by the technique disclosed in Non-Patent Document 1, the LSI chip 1 and the optical interconnection chip 2 may be bonded together. When the bonded structure is used, the length of electric wiring becomes shorter. This makes it possible to transmit electric signals at high speed. Further, the connection section 4 may be configured such that the optical interconnection chip 2 and LSI chip 1 can be electrically connected by wire bonding. However, this leads to an increase in length of wiring, and thus the use of the bump is preferable.

The optical interconnection chip 2 has formed therein an optical element having a function relating to signal conversion between light and electricity (not shown). Examples of the optical element include a luminous element, an optical modulator, and a photo-sensitive element. The optical element is disposed so as not to electrically interfere with the transmission section 3 of semiconductor chip 1.

In the semiconductor optical interconnection device, the LSI chip 1 and the optical interconnection chip 2 are electrically connected. Specifically, the connection section 4 electrically connects with the optical element mounted on the optical interconnection chip 2. This makes it possible to transmit signals between the LSI chip 1 and the optical interconnection chip 2. The optical element connects with the connection section 4, but the connection section 4 is disposed so as not to interfere with the transmission section 3. As a result, the transmission section 3 and the optical element can be disposed so as not to interfere each other.

Hereinafter, each example illustrates an exemplary configuration of the semiconductor optical interconnection device which is based on the configuration of FIG. 1. In the following descriptions, a coil is used as an example of the transmission section 3, and a connecting bump is used as an example of the connection section 4.

First Example

FIG. 2 is a cross-section view showing an exemplary configuration in which semiconductor optical interconnection devices shown in FIG. 1 are laminated. The semiconductor optical interconnection device shown in FIG. 2 shows a configuration in which a plurality of combinations of the LSI chips 1 and the optical interconnection chips 2 are laminated. The LSI chip (first LSI chip) 1-1; an optical interconnection chip (first optical interconnection chip) 2-1, a spacer 6, the LSI chip (second LSI chip) 1-2, and an optical interconnection chip (second optical interconnection chip) 2-2 are laminated. The LSI chip 1-1 and the optical interconnection chip 2-1 are electrically connected via connecting bumps 7, with the result that the surfaces of the chips are bonded together. Similarly, the LSI chip 1-2 and the optical interconnection chip chip 2-2 are electrically connected via the connecting bumps 7, with the result that the surfaces thereof are bonded together.

A plurality of coils 8 are integrated on the LSI chips 1-1 and 1-2. The coils 8 are formed of a sending coil and a receiving coil. The sending coil is connected to a sending circuit, and the receiving coil is connected to a receiving circuit. The receiving coil is formed larger than the sending coil. The LSI chip 1-1 transmits signals to the LSI chip 1-2, which is disposed across the optical interconnection chip 2-1, by using the coils 8. The LSI chip 1-1 and the LSI chip 1-2 are not directly electrically connected to each other, but signal transmission therebetween can be achieved by an inductive coupling via the plurality of coils 8 integrated on each chip. As just described, in the semiconductor optical interconnection device in which the plurality of combinations of the LSI chips 1 and optical interconnection chips 2 are laminated, signal transmission between the laminated LSI chips 1 can be carried out in a non-contact manner via the coils or an inductor, with the optical interconnection chip 2 interposed.

In the optical interconnection chips 2-1 and 2-2, the optical element is disposed in an area without interference with the coils 8 integrated on the LSI chip 1-1 and the coils 8 integrated on the LSI chip 1-2. Specifically, the optical element is not disposed in an area between the coils 8 integrated on the LSI chip 1-1 and the coils 8 integrated on the LSI chip 1-2. That is to say, the optical element is not disposed in an area without interference due to the signal transmission between two the transmission sections 3 respectively belonging to the two LSI chips. More specifically, the optical element is not disposed in an area sandwiched between the two transmission sections 3.

These bonded chips are laminated on a mounted board 5 with the spacer 6. The LSI chips 1-1 and 1-2 are connected to a mounted board 5 by an externally-connected wire 9, thereby enabling input/output of signals with the outside and power supply.

Figure 3:
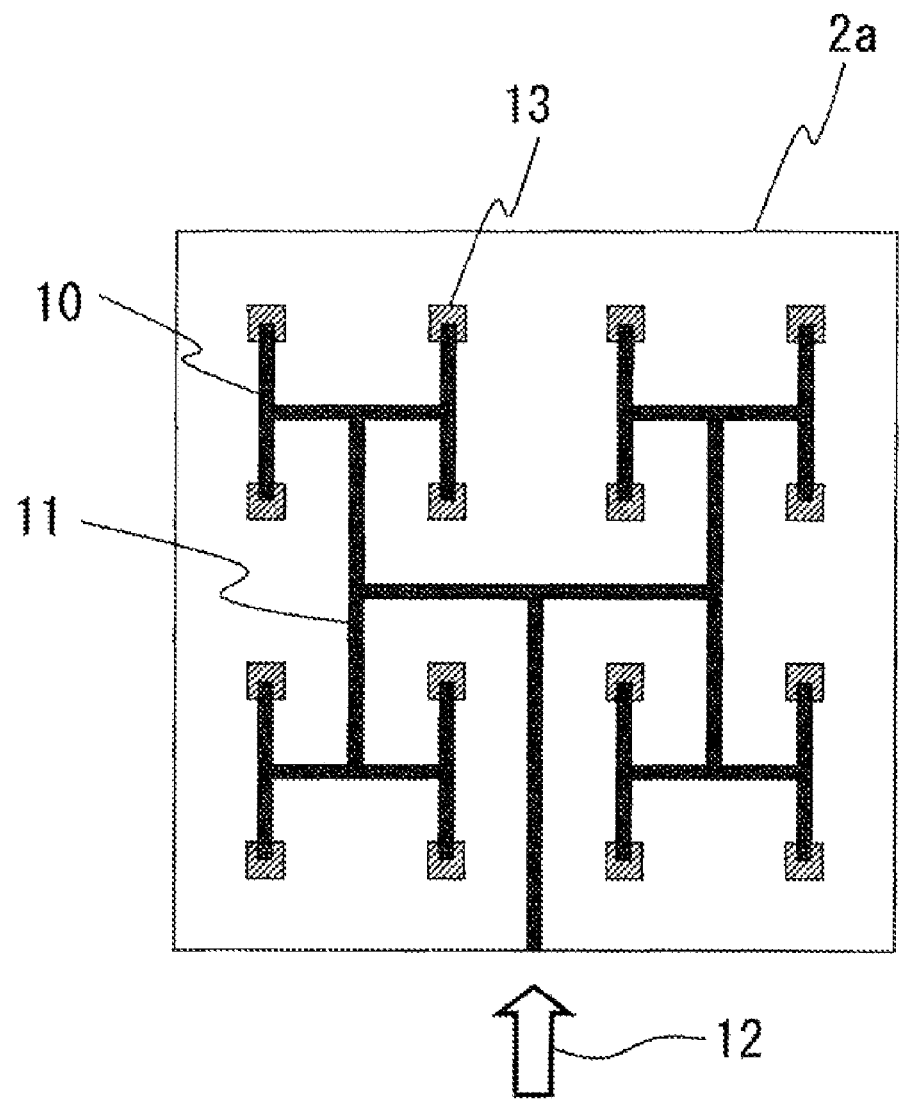
FIG. 3 is a plan view showing an exemplary configuration of an optical interconnection chip of a first example.
Figure 4:
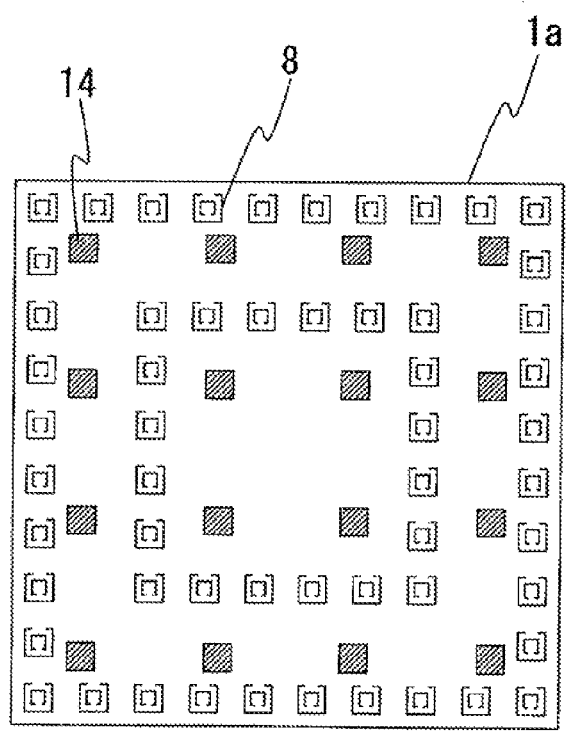
FIG. 4 is a plan view showing an exemplary configuration of an LSI chip of the first example.

Referring next to FIGS. 3 and 4, description is given of an exemplary planar configuration of each of the semiconductor chip 1 and the optical interconnection chip 2 that supply the LSI chip 1 with a clock signal using the optical interconnection chip 2.

FIG. 3 is a plan view showing an exemplary configuration of the optical interconnection chip of the first example. An optical interconnection chip 2a is an example of a planar configuration of the optical interconnection chip 2 shown in FIG. 1 or 2. The optical interconnection chip 2a includes an optical waveguide 10 and photo-sensitive elements 13. The optical waveguide 10 includes an optical branching structure 11 that forms a plurality of terminals, and receives clock signal light 12 from one end of the terminals. The photo-sensitive elements 13 are disposed at the other end of the terminals.

The clock signal light 12 propagates through the optical waveguide 10, and is distributed to the entire optical interconnection chip 2a via the optical branching structure 11. The distributed clock signal light 12 is converted from a light signal to an electric signal by the photo-sensitive elements 13. The clock signal converted to the electric signal by the photo-sensitive elements 13 is transmitted to the LSI chip 1. This makes it possible to distribute the clock signal to all over the LSI chip 1.

In addition, it is preferable that the photo-sensitive elements 13 be disposed at regular optical intervals in order to distribute the clock signal all over the LSI chip 1 in FIG. 3. Though an external light source is used as a source of the clock signal light, the luminous element may be integrated on the optical interconnection chip 2a.

FIG. 4 is a plan view showing an exemplary configuration of the LSI chip of the first example. An LSI chip 1a is an example of a planar configuration of the LSI chip 1 shown in FIG. 1 or 2. On the LSI chip 1a, photo-sensitive element connecting bumps 14 are formed and the coils 8 are disposed. The photo-sensitive element connecting bumps 14 electrically connect to the photo-sensitive elements 13 of the optical interconnection chip 2a. The coils 8 are disposed so as not to interfere with the photo-sensitive element connecting bumps 14. The clock signal converted to the electric signal in the photo-sensitive elements 13 is distributed all over the LSI chip 1a via the photo-sensitive element connecting bumps 14.

In the semiconductor optical interconnection device shown in FIGS. 2 to 4, a low-jitter, high-frequency clock signal can be distributed all over the LSI chip 1a with low attenuation by using an optical wiring. Therefore, it is possible to achieve the LSI chip 1a having high functionality and synchronized with a high-quality, high-frequency clock signal throughout the chip. Further, light can transmit a high-frequency signal for a long distance with lower attenuation than electricity, so that low consumed power can be achieved.

When a plurality of optical interconnection chips 2 are provided, the configuration of the optical interconnection chip 2a allows the clock signal light 12 from the outside to be branched into a plurality of light beams and to be input into each of the optical interconnection chips. This facilitates synchronization of the laminated chips, which is difficult for electric wiring.

The LSI chip 1-1 and the LSI chip 1-2 are able to transmit signals in a non-contact manner via the coils 8 using the inductive coupling. Accordingly, there is no need to form any through-hole in the optical interconnection chips 2-1 and 2-2, and the layout of the optical waveguide 10 is not restricted. However, active devices, such as the photo-sensitive elements 13, the luminous element, and the optical modulator interfere with each other, when these are sandwiched between coils 8. Thus, this must be avoided.

It is preferable that the distance between the LSI chip 1-1 and the LSI chip 1-2 be shorter in order to achieve efficient inductive coupling. Therefore, the optical interconnection chip 2 is preferably as thin as possible. However, if it is made be too thin, manufacture process becomes difficult due to warpage of a substrate or the like. In this regard, the thickness of the optical interconnection chip 2 is preferable to be less than or equal to about 100 μm in the LSI optical interconnection structure of the invention. In order to reduce the thickness of the optical interconnection chip 2, it is preferable to use a waveguide having a high refractive index difference and a high light confinement effect. Specifically, Si, SiON, or SiN may be used as core material of the optical waveguide 10, and $SiO_2$ may be used as clad material to form a preferable an optical waveguide having a high refractive index difference. In this case, a wavelength of light is especially preferable to be more than or equal to about 1.1 μm when Si is used as the core material, and to be more than or equal to about 0.7 μm when SiON or SiN is used as the core material.

The interference between the optical interconnection chips can be prevented by using opaque material to absorb signal light as the spacer 6 to remove a stray light component. This makes it possible to prevent deterioration in quality of the clock signal due to noise.

Further, in the LSI optical interconnection structure of the invention, the optical interconnection chip is made smaller than the LSI chip, thereby obtaining an advantageous effect of facilitating wire bonding that connects the LSI chip and the mounted board.

When the clock signal light 12 is input using an optical fiber, alignment is difficult, because the optical interconnection chips are reversely bonded. The alignment can be facilitated by forming a V-shaped groove, which allows an optical fiber to be mounted using passive alignment, on the side of LSI chip which is bonded to the optical interconnection chip.

Second Example

In a second example, description is given of a case where the LSI chip 1 has a plurality of multiprocessors and the optical interconnection chip 2 transmits signals between the plurality of multiprocessors. In this example, components shown in FIGS. 1 and 2 are the same.

Figure 5:
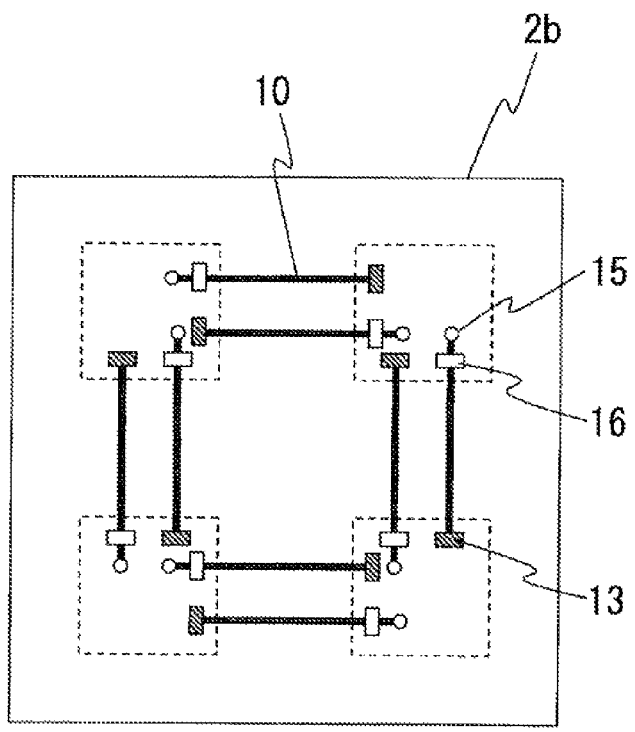
FIG. 5 is a plan view showing an exemplary configuration of an optical interconnection chip of a second example.

FIG. 5 is a plan view showing an exemplary configuration of an optical interconnection chip of the second example. An optical interconnection chip 2*b* is an example of a planar configuration of the optical interconnection chip 2 shown in FIG. 1 or 2. The optical interconnection chip 2*b* includes luminous elements 15, optical modulators 16, and the photo-sensitive elements 13 integrated thereon, and the optical waveguide 10 formed thereon. Hereinafter, a combination of optical elements integrated on the optical interconnection chip 2 is referred to as an element combination. FIG. 5 shows an example where the element combination includes the luminous elements 15, the optical modulators 16, and the photo-sensitive elements 13. A plurality of element combinations and the optical waveguide 10 have a function to transmit data between the processor cores in the bonded LSI chips. The optical modulators 16 are electrically connected to the processor cores. The optical modulators 16 modulate light emitted from the luminous elements 15 to convert an electric signal into a light signal, and transmit the signal to a photo-sensitive element electrically connected to another processor core. In FIG. 5, though an external modulation system by the optical modulators 16 is used, a direct modulation system may be used. The direct modulation system dynamically controls light emitted from the luminous elements 15. Therefore, the element combination may include at least the luminous elements 15 and the photo-sensitive elements 13.

Figure 6:
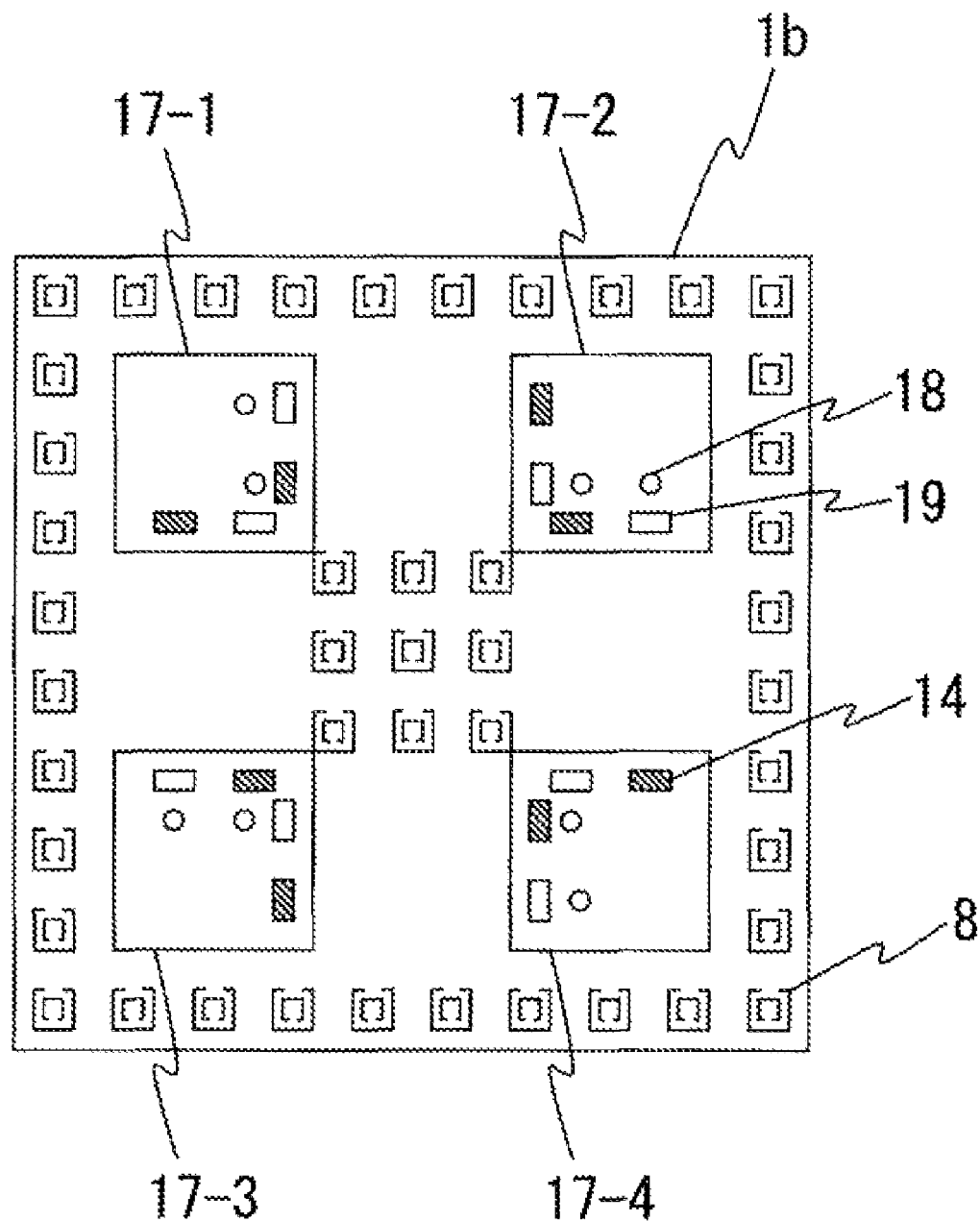
FIG. 6 is a plan view showing an exemplary configuration of an LSI chip of the second example.

FIG. 6 is a plan view showing an exemplary configuration of an LSI chip of the second example. An LSI chip 1*b* is an example of a planar configuration of the LSI chip 1 shown in FIG. 1 or 2. The LSI chip 1*b* includes a plurality of processor cores 17-1 to 17-4. The photo-sensitive element connecting bumps 14 that electrically connect to the photo-sensitive elements 13 of the optical interconnection chip 2*b*, luminous element connecting bumps 18 to electrically connect to the luminous elements 15, and optical modulator connecting bumps 19 to electrically connect to the optical modulators 16 are formed on each processor core 17. These bumps and the coils 8 are disposed so as not to interfere with each other.

As shown in FIGS. 5 and 6, the optical interconnection chip 2*b* includes an optical circuit composed of the luminous elements 15, the optical modulators 16, the optical waveguide 10, and the photo-sensitive elements 13 in the semiconductor optical interconnection device of this example. The LSI chip 1*b* includes the plurality of processor cores 17. The element combination electrically connects to the plurality of multi-processors. This makes it possible to transmit data between the plurality of processors by an optical circuit.

Unlike the first example, data transmission between the processor cores 17 is performed by using optical interconnection in the second example. The use of the optical interconnection makes it possible to transmit a large amount of data with low power consumption. The semiconductor chip 1*b* includes the plurality of bumps electrically connected to the element combination in each of the processor cores 17-1 to 17-4, thereby enabling transmission of signals between the plurality of processors via the element combination and the plurality of bumps.

Note that FIG. 5 shows an example of light data transmission using a single wavelength, but a wavelength multiplex system which uses a plurality of wavelengths may be used. The use of the wavelength multiplex system makes it possible to transmit larger amounts of data at high density. The LSI optical interconnection structure may be composed so that both the clock signal distribution by light as described in the first example and the data transmission by light as described in this example are carried out at the same time.

Though FIGS. 5 and 6 show an example where processor cores 17 are optically connected in one-to-one correspondence, optical interconnection may be formed so as to connect the processor cores 17 as a network. For instance, an SoC (System on Chip) in which a CPU and a memory are connected by optical interconnection may be formed.

Third Example

Figure 7:
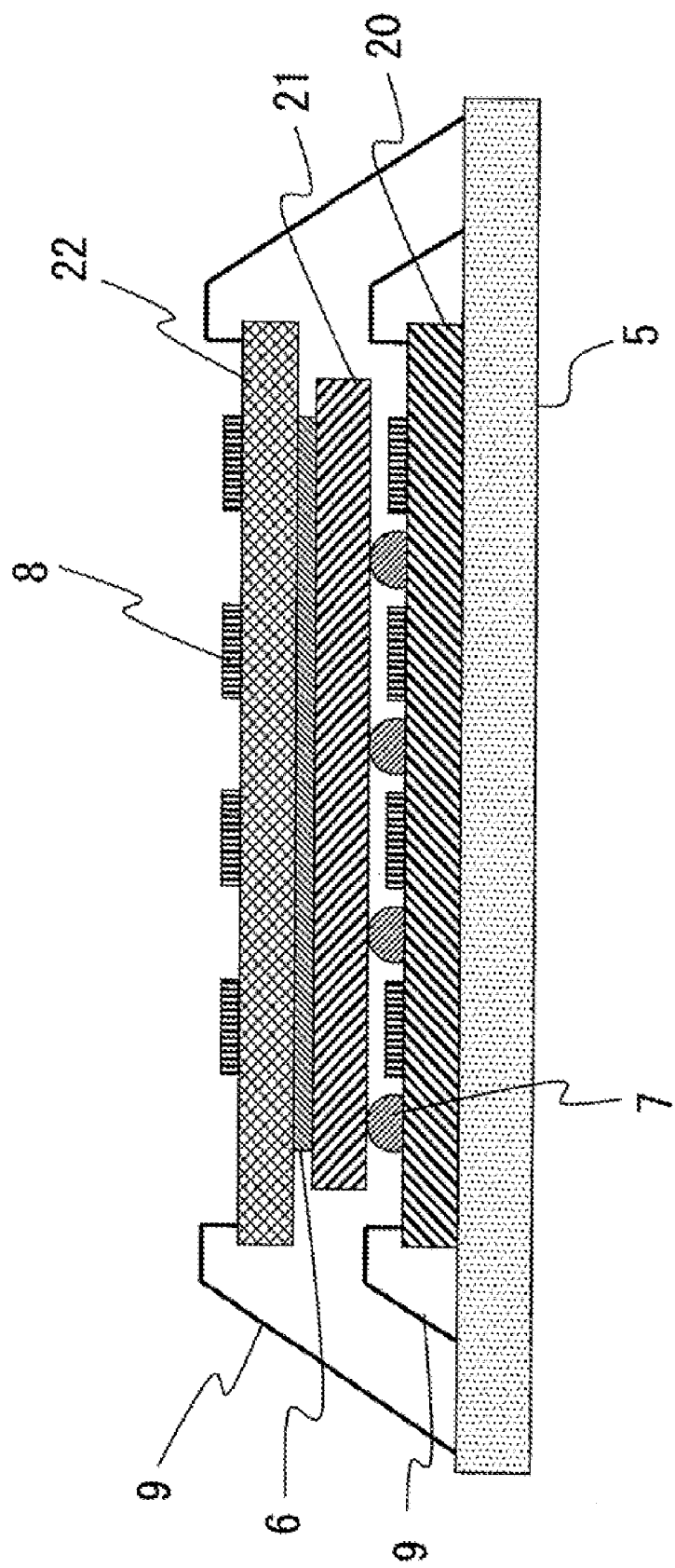
FIG. 7 is a cross-section view showing an exemplary configuration of a semiconductor optical interconnection chip of a third example.

FIG. 7 is a cross-section view showing an exemplary configuration of a semiconductor optical interconnection device of a third example. An external I/O (Input/Output) chip (input/output chip) 22 is laminated on an LSI chip 20 and an optical interconnection chip 21, the surfaces of which are bonded together. The LSI chip 20 is the same as the LSI chip 1 shown in FIGS. 1 and 2. The optical interconnection chip 21 is the same as the optical interconnection chip 2 shown in FIGS. 1 and 2. The external I/O chip 22 includes the coils 8 and electrode pads which input/output signals with the outside. The electrode pads are, for example, chips having formed thereon an electrode to input/output a signal to/from an electric circuit on the mounted board. The LSI chip 20 is able to transmit signals via the external I/O chip 22 and the coils 8 by the inductive coupling. The LSI chip 20 is also able to input/output signals to/from the electric circuit on the mounted board 5 through the externally-connected wire 9. Additionally, the coils 8 are illustrated by way of example, another transmission section 3 such as an inductor may be included.

Even when the surfaces of the LSI chip 20 and the optical interconnection chip 21 are bonded together, an advantageous effect of enabling the mounting without restrictions on the number of the electrode pads to input/output the signals to/from the outside is obtained by using the LSI optical interconnection structure of this example. The external I/O chip 22 is laminated on the bonded structure of a pair of the LSI chip 20 and the optical interconnection chip 21 in FIG. 7. However, the external I/O chip 22 may be laminated on a plurality of bonded structures of LSI chips 20 and optical interconnection chips 21. Specifically, it is suitable for highly-efficient signal transmission between laminated LSI chips in a structure where highly functionalized LSI chips are laminated.

Note that the external I/O chip 22 is not limited in this example. For example, in addition to the LSI chip 20 and the optical interconnection chip 21, a memory chip including the transmission section 3 such as coils or an inductor may be laminated. This enables the LSI chip 20 and the memory chip to transmit the signals via the transmission section 3 in a non-contact manner.

Further, FIG. 7 shows an example where the external I/O chip 22 is laminated on a pair of the LSI chip 20 and the optical interconnection chip 21. The configuration is not limited to this, and the external I/O chip 22 or a memory chip may be laminated on the plurality of combinations of the LSI chip 20 and the optical interconnection chip 21.

Other Exemplary Embodiments

In the bonded structure of the LSI chip 1 and the optical interconnection chip 2, the semiconductor optical interconnection device according to this invention transmits signals between laminated LSI chips in a non-contact manner by using the inductive coupling, with an optical interconnection layer interposed between the LSI chips. The configuration is not limited to the above examples, and other configurations having the foregoing configuration may be used.

The semiconductor optical interconnection device of each example will be manufactured by at least the following steps. The steps are described below by referring to FIG. 1. A step of producing the optical interconnection chip 2 having the optical element formed thereon. A step of producing the semiconductor chip 1 having the transmission section 3 to transmit the signals in a non-contact manner. A step of forming the connection section 4 that electrically connects with the optical element on the semiconductor chip 1. A step of laminating the optical interconnection chip 2 and the semiconductor chip 1 so as to electrically connect the optical element and the connection section 4. Here, either the step of producing the optical interconnection chip 2 or the step of producing the semiconductor chip 1 may be executed first. However, it is preferable to produce each chip after determining the layout in such a way that the optical element and the connection section 4 are electrically connected.

Even when the optical interconnection chip exits between laminated LSI chips, the signal transmission between the LSI chips can be achieved by using one of the semiconductor optical interconnection devices having the optical interconnection structure of the above examples. As a result, it is possible to efficiently laminate highly functionalized LSI chips by introducing an optical interconnection. Also in the structure in which the surfaces of the chips are bonded together, signal input/output with the outside can be facilitated by using the inductive coupling.

Lithography technique enables alignment with high precision, because the optical signal transmission within the optical interconnection chip uses the optical waveguide. Moreover, the present invention has a feature that the alignment at the time of chip lamination is easier than that of a system to transmit the signals in the laminating direction using light, because the signal transmission in the laminating direction is performed by the inductive coupling. Highly-efficient inductive coupling can be achieved by reducing the thickness of an optical interconnection chip existing among laminated LSI chips, thereby ensuring a sufficient signal intensity. The inductive coupling system is unsuitable for high-speed signal transmission in a horizontal direction within a chip. However, this invention uses light for the signal transmission within the chip, which can make the LSI chip itself highly functional.

The use of the inductive coupling in the above each example eliminates the need to make any through-hole in an optical interconnection layer. Therefore, there is an advantage that the layout of the optical waveguide is not restricted. At this time, signal light to propagating through the optical waveguide is not interfered by the inductive coupling, which makes it possible to dispose the optical waveguide between coils to provide the inductive coupling.

Furthermore, FIG. 2 shows the signal transmission between two LSI chips 1 which are adjacent to the optical interconnection chips 2. The configuration is not limited to this. When three or more combinations of the LSI chip 1 and the optical interconnection chip 2 are laminated, it is also possible to transmit the signals between two LSI chips 1 which sandwich the LSI chip 1 and the optical interconnection chip 2 therebetween depending on the transmission capability (transmission distance) of the coils 8 in the non-contact manner. In this case, in one or more optical interconnection chips 2 and one or more the LSI chips 1, which are sandwiched by the two LSI chips 1 to transmit the signals, the optical element and the connection section 4 need to be disposed in an area without electric interference with the transmission section 3.

The invention of this application has been described above with reference to the exemplary embodiments and the examples, but the invention of this application is not limited to the exemplary embodiments and the examples. The configurations or the details of the invention of this application may be practiced with various modifications that those skilled in the art will recognize within the scope of the invention of this application.

The invention claimed is:

1. A semiconductor optical interconnection device comprising:
   an optical interconnection chip having an optical element formed thereon, the optical element having a function relating to signal conversion between light and electricity; and
   a semiconductor chip that includes a transmission section to transmit a signal in a non-contact manner, and a connection section to electrically connect with the optical element,
   wherein a plurality of combinations of the semiconductor chip and the optical interconnection chip are laminated, and
   two transmission sections that are respectively mounted on two semiconductor chips are used to transmit signals, the two semiconductor chips being disposed with the optical interconnection chip interposed therebetween.

2. The semiconductor optical interconnection device according to claim 1, wherein the connection section is disposed in an area without interference with the transmission section.

3. The semiconductor optical interconnection device according to claim 1, wherein the optical element is disposed in an area without interference with the transmission section.

4. The semiconductor optical interconnection device according to claim 1, wherein
   the connection section uses a bump, and
   when the optical interconnection chip electrically connects to the connection section, the optical interconnection chip is bonded to the semiconductor chip.

5. The semiconductor optical interconnection device according to claim 1, wherein the optical element is disposed in an area without interference by the signal transmission between the two transmission sections.

6. The semiconductor optical interconnection device according to claim 1, wherein the optical element is not disposed, in an area sandwiched between the two transmission sections.

7. The semiconductor optical interconnection device according to claim 1, wherein
   the optical interconnection chip includes an optical waveguide and at least one photo-sensitive element as the optical element,
   the optical waveguide receives clock signal light, and
   the at least one photo-sensitive element transmits a clock signal based on the clock signal light to the semiconductor chip.

8. The semiconductor optical interconnection device according to claim 7, wherein
the optical waveguide includes an optical branching structure that forms a plurality of terminals, and
the at least one photo-sensitive element is composed of a plurality of photo-sensitive elements disposed the plurality of terminals of the optical waveguide.

9. The semiconductor optical interconnection device according to claim 8, wherein
the plurality of terminals are formed at regular optical intervals.

10. The semiconductor optical interconnection device according to claim 1, wherein
the semiconductor chip includes a plurality of processor cores,
the optical interconnection chip includes a plurality of element combinations including at least a luminous element and the photo-sensitive element as the optical element, and an optical waveguide, and
at least one element combination is disposed in each of the processor cores, and electrically connects to the processor cores disposed.

11. The semiconductor optical interconnection device according to claim 10, wherein the optical waveguide connects the luminous element disposed in one processor core to the photo-sensitive element disposed in another processor core.

12. The semiconductor optical interconnection device according to claim 1, further comprising an input/output chip laminated thereon, the input/output chip including the transmission section and an electrode to input and output signals to and from an electric circuit on a mounted board.

13. The semiconductor optical interconnection device according to claim 1, further comprising a memory chip laminated thereon, the memory chip including the transmission section.

14. The semiconductor optical interconnection device according to claim 1, wherein the transmission section is at least one of a coil, an inductor, and a capacity coupling section.

15. The semiconductor optical interconnection device according to claim 1, wherein the optical interconnection chip has a size smaller than the semiconductor chip.

16. The semiconductor optical interconnection device according to claim 1, wherein the optical interconnection chip has a thickness less than or equal to 100 µm.

17. The semiconductor optical interconnection device according to claim 1, wherein the optical interconnection chip includes an optical waveguide made of one of Si, SiON, and SiN as core material.

18. A method of forming a semiconductor optical interconnection device comprising:
producing an optical interconnection chip having an optical element formed thereon, the optical element having a function relating to signal conversion between light and electricity;
producing a semiconductor chip that includes a transmission section to transmit a signal in a non-contact manner;
forming a connection section on the semiconductor chip, the connection section being electrically connected with the optical element; and
laminating the optical interconnection chip and the semiconductor chip so as to electrically connect the optical interconnection chip and the semiconductor chip, and
laminating a plurality of combinations of the semiconductor chip and the optical interconnection chip,
wherein laminating the plurality of combinations so as to laminate the two transmission sections that are respectively mounted on two semiconductor chips are used to transmit signals, the two semiconductor chips being disposed with the optical interconnection chip interposed therebetween.

* * * * *